US009515642B2

United States Patent
Marsili et al.

(10) Patent No.: US 9,515,642 B2
(45) Date of Patent: *Dec. 6, 2016

(54) PULSE MODULATION CONTROL IN A DC-DC CONVERTER CIRCUIT

(71) Applicant: Infineon Technologies AG, Neubiberg (DE)

(72) Inventors: Stefano Marsili, Faak am See (AT); Dietmar Straeussnigg, Villach (AT); Luca Bizjak, Villach (AT); Robert Priewasser, Klagenfurt (AT); Matteo Agostinelli, Villach (AT)

(73) Assignee: Infineon Technologies AG, Neubiberg (DE)

( * ) Notice: Subject to any disclaimer, the term of this patent is extended or adjusted under 35 U.S.C. 154(b) by 241 days.

This patent is subject to a terminal disclaimer.

(21) Appl. No.: 14/165,564

(22) Filed: Jan. 27, 2014

(65) Prior Publication Data

US 2014/0139296 A1 May 22, 2014

Related U.S. Application Data

(63) Continuation of application No. 12/714,479, filed on Feb. 27, 2010, now Pat. No. 8,638,079.

(51) Int. Cl.
*H02P 31/00* (2006.01)
*G05F 1/00* (2006.01)
*H03K 7/08* (2006.01)
*H02M 3/158* (2006.01)

(52) U.S. Cl.
CPC ............... *H03K 7/08* (2013.01); *H02M 3/158* (2013.01); *G05F 1/00* (2013.01)

(58) Field of Classification Search
CPC ................................. H02P 31/00; H03K 7/08
See application file for complete search history.

(56) References Cited

U.S. PATENT DOCUMENTS

| 7,990,122 B2 * | 8/2011 | Sase | H02M 3/157 323/283 |
|---|---|---|---|
| 8,513,933 B2 * | 8/2013 | Notman | H02M 3/1588 323/284 |
| 2003/0173941 A1 | 9/2003 | Harris et al. | |

(Continued)

OTHER PUBLICATIONS

Jakobson, L.T. Andersen, "Digitally controlled point of load converter with very fast transient response", In the proceedings of the IEEE Conference on Power Electronics and Applications, 2007, pp. 1-10.

(Continued)

*Primary Examiner* — Emily P Pham
(74) *Attorney, Agent, or Firm* — Slater Matsil, LLP

(57) ABSTRACT

In a device, a pulse modulation switching logic is provided to generate switching signals of a pulse modulator so as to generate a pulse modulated signal with a first pulse modulation control parameter and a second pulse modulation control parameter. The first pulse modulation control parameter is controlled on the basis of a first control signal, and the second pulse modulation control parameter is controlled on the basis of a second control signal. A first control loop is provided to generate the first control signal from an output signal derived from the pulse modulated signal. A second control loop is provided to generate the second control signal on the basis of the output signal. The first and second control signals are applied to concurrently control the first and second pulse modulation control parameters.

21 Claims, 12 Drawing Sheets

(56) References Cited

U.S. PATENT DOCUMENTS

| | | | |
|---|---|---|---|
| 2005/0116698 A1 | 6/2005 | Prinz X et al. | |
| 2005/0127881 A1* | 6/2005 | Sase | H02M 3/156 323/225 |
| 2006/0043948 A1 | 3/2006 | Li et al. | |
| 2007/0024252 A1 | 2/2007 | Marino et al. | |
| 2008/0218284 A1 | 9/2008 | Chen | |
| 2008/0238397 A1* | 10/2008 | Chen | H02M 1/36 323/288 |
| 2008/0272747 A1 | 11/2008 | Melanson | |
| 2012/0161740 A1* | 6/2012 | Vogman | H02M 3/156 323/286 |

OTHER PUBLICATIONS

Simon-Muela, A.El basri, Y. Lahore, C. Seguier, L Alonso, C. Bolter, V. Estibals, B. Chaptal, J.L., "High-freqeuncy digital point-of-load converter using a 16 bits DSC.", In the proceedings of the IEEE International Symposium on Industrial Electronics, 2008. ISIE 2008, pp. 50-55.

Oliva, A.R. Ang, S.S. Bortolotto, G.E., "Digital control of a voltagemode synchronous buck converter", In the IEEE Transactions on Power Electronics, Jan. 2006, vol. 21, Issue: 1, pp. 157-163.

* cited by examiner

PULSE MODULATION CONTROL IN A DC-DC CONVERTER CIRCUIT

RELATED APPLICATIONS

This application is a continuation application of U.S. patent application Ser. No. 12/714,479, which was filed on Feb. 27, 2010. The entire contents of the indicated U.S. patent application are hereby incorporated herein by reference.

BACKGROUND OF THE INVENTION

In the field of electronics, it is known to use DC-DC converters for the purpose of converting a substantially constant input signal to a substantially constant output signal having a different, i.e. smaller or larger, value. The substantially constant input and output signals are also referred to as DC (Direct Current) signals, bearing in mind that these signals may be subject to some amount of variation or may also be discontinuous.

In some type of DC-DC converters, pulse width modulation of the input signal is used in the conversion process. The output signal may then be regulated to a desired value by generating an error signal and determining an adjusted duty cycle of pulse width modulation from the error signal. As an alternative, pulse frequency modulation may be used. In this case, the output signal may be regulated to a desired value by determining an adjusted frequency of pulse frequency modulation from the error signal. In some situations, e.g. when the output signal is subjected to an abrupt load change, it may take some time until the output signal is regulated to its desired value.

Accordingly, there is a need for DC-DC converter circuits providing efficient control of the output signal value and high stability of the output signal.

DETAILED DESCRIPTION OF EMBODIMENTS OF THE INVENTION

Figure 1:
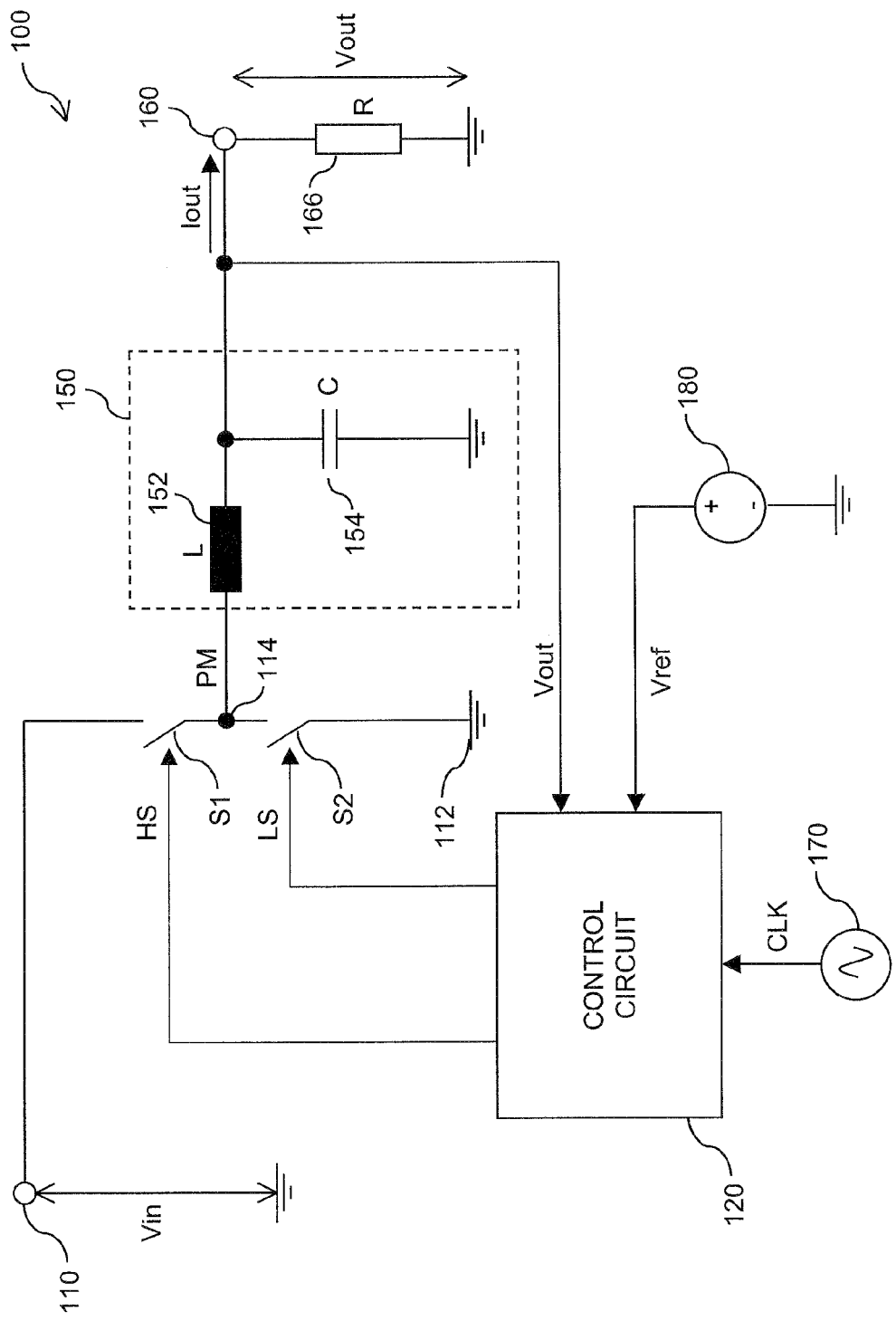
FIG. 1 schematically illustrates a DC-DC converter circuit according to an embodiment of the invention.

In the following, some embodiments of the present invention will be described in more detail and with reference to the accompanying drawings. It is to be understood that the following description is given only for the purpose of illustration and is not to be taken in a limiting sense. The scope of the invention is not intended to be limited by the embodiments as described hereinafter, but is intended to be limited only by the appended claims.

Further, it is to be understood that in the following description of embodiments any direct connection or coupling between functional blocks, devices, components, circuit elements or other physical or functional units as described or shown in the drawings could also be implemented by an indirect connection or coupling, i.e. a connection or coupling comprising one or more intervening elements. Furthermore, it should be appreciated that functional blocks or units shown in the drawings may be implemented as separate circuits, but may also be fully or partially implemented in a common circuit. In other words, the description of various functional blocks is intended to give a clear understanding of various functions performed in a device and is not to be construed as indicating that these functional blocks have to be implemented as separate functional units. For example, one or more functional blocks may be implemented by programming a processor with suitably designed program code.

It should be noted that the drawings are provided to give an illustration of some aspects of embodiments of the present invention and therefore are to be regarded as schematic only. In particular, the elements as shown in the drawings are not necessarily to scale with each other, and the placement of various elements and drawings is chosen to provide a clear understanding of the respective embodiment and is not to be construed as necessarily being a representation of the actual relative location of the illustrated structures.

It is to be understood that the features of the various embodiments described herein may be combined with each other as appropriate. On the other hand, describing an embodiment with a plurality of features is not to be construed as indicating that all the described features are necessary for practicing the present invention. For example, other embodiments may comprise less features and/or alternative features.

Turning now to the figures, FIG. 1 schematically illustrates DC-DC converter circuit 100 according to an embodiment of the present invention. According to the illustrated embodiment, the DC-DC converter circuit 100 is implemented as a step-down buck converter. However, it is to be understood that the concepts as described herein may also be applied to other known types of DC-DC converter circuits, e.g. step-up converters.

As illustrated, the DC-DC converter circuit 100 includes a signal input 110, which has the purpose of receiving a DC input signal. In the illustrated example, the DC input signal is a DC voltage Vin. It is to be understood, that in some embodiments the DC input signal may also be defined as a DC current. Further, the DC-DC converter circuit 100 includes a first switch S1 and a second switch S2 coupled in series between the signal input 110 and a reference node 112, in the illustrated example ground. The first switch S1 is configured to selectively couple an intermediate node 114 between the first switch and the second switch S2 to the signal input 110, and the second switch S2 is configured to selectively couple the intermediate node 114 to the reference node 112. The switches S1 and S2 may be implemented as transistors, e.g. MOS transistors or the like. Accordingly, by controlling the switches S1 and S2 in a complementary manner, i.e. by bringing one of the switches to a closed state while the other is brought to the open state, the intermediate node can be coupled to either the signal input 110 or to the reference node 112, thereby generating a pulse modulated signal PM at the intermediate node 114.

Typical characteristics of the pulse modulated signal PM are explained in more detail in connection with FIG. 2. According to some embodiments, the pulse modulated signal PM may be a pulse width modulated signal, i.e. a signal in which the frequency is substantially constant and the duty cycle varies as a pulse modulation control parameter. According to further embodiments, the pulse modulated signal PM may be a pulse frequency modulated signal, i.e. a signal in which the duty cycle is substantially constant and the frequency varies as a pulse modulation control parameter. According to still further embodiments, both the duty cycle and the frequency of the pulse modulated signal PM may vary as pulse modulation control parameters.

As further illustrated, the DC-DC converter includes a control circuit 120. The control circuit 120 is configured to generate a first switching signal HS for the first switch S1 and a second switching signal LS for the second switch S2. As mentioned above, the switching signals are generated in a complementary manner, i.e. if the first switching signal causes the first switch S1 to be closed, the second switching signal S2 causes the second switch S2 to be open and vice versa.

As further illustrated, the DC-DC converter circuit 100 includes an output filter 150. The output filter 150 is coupled to the intermediate node 114 to receive the pulse modulated signal PM and generate a filtered output signal therefrom. The filtered output signal is supplied to a signal output 160 of the DC-DC converter circuit 100. According to the illustrated embodiment, the output filter 150 is implemented with a low-pass filter characteristic, e.g. on the basis of a filter circuit including an inductor 152, and a capacitor 154. More specifically, the inductor 152 is coupled between the intermediate node 114 and the signal output 160, and the capacitor 154 and the resistor 156 are coupled in parallel between the signal output 160 and the reference node 112, i.e. ground. It is to be understood that other implementations of the output filter 150 may be used as well, e.g. more complex filter circuits using one or more additional inductors, capacitors, resistors, or other elements. By means of the output filter 150, the pulse modulated signal PM may be transformed into a substantially constant output signal, i.e. a DC output signal, at the signal output 160. In the illustrated example, the DC output signal at the signal output is a DC voltage Vout as measured over an output load, in the illustrated example formed by a load resistor 166. It is to be understood, that in some embodiments the DC output signal may also be defined as a DC current, e.g. an output current Iout as illustrated in FIG. 1.

In the illustrated example, the control circuit 120 is configured to generate the switching signals HS, LS in response to a feedback signal. In the illustrated example, the feedback signal is derived directly from DC output voltage at the signal output 160. In other embodiments, the feedback signal may be derived in a different manner, e.g. from an intermediate circuit node of the output filter 150. For example, the feedback signal could also be derived as a current through the inductor 152. In some embodiments multiple feedback signals, derived in different ways, may be supplied to the control circuit 120. In this way, the control circuit 120 may adjust pulse modulation control parameters of the pulse modulated signal PM so as to regulate the DC output signal to a nominal value. According the concepts as explained herein, this is accomplished by concurrently acting on at least two different pulse modulation control parameters. For example, the pulse modulated signal PM may be a pulse width modulated signal, and the control circuit 120 may concurrently adjust the duty cycle of the next pulse period of the pulse width modulated signal and the duration of an ongoing pulse of the pulse width modulated signal. According to a further example, the pulse modulated signal PM may be a pulse frequency modulated signal, and the control circuit 120 may concurrently adjust the frequency of the pulse width modulated signal and the duration of an ongoing pulse of the pulse width modulated signal. According to a still further example, the control circuit 120 may concurrently adjust the pulse duration and the frequency of the pulse modulated signal PM. Details of control mechanisms according to embodiments of the invention will be explained below.

As further illustrated, the DC-DC converter circuit 100 includes a clock signal source 170, which supplies a clock signal CLK to the control circuit 120. In the control circuit 120, the clock signal CLK may be used as a basis for operating digital circuit elements. According to some embodiments, the clock signal CLK has a frequency which is higher than the typical frequency of the pulse modulated signal PM, which allows for using oversampling techniques in the process of generating the switching signals HS, LS.

As further illustrated, the DC-DC converter circuit 100 includes a reference signal source 180 which supplies a reference signal, in the illustrated example a constant reference voltage Vref, to the control circuit 120. In the control circuit 120, the reference signal may be used for generating an error signal, e.g. by comparing it to the feedback signal from the signal output 160.

It is to be understood that in some embodiments the clock signal source 170 and/or the reference signal source 180 may be omitted, e.g. if the clock signal CLK or the reference signal are received from external signal sources.

The DC-DC converter circuit 100 may be implemented using one or more integrated circuits, possibly in combination with additional discrete elements like resistors, capacitors, inductors, diodes, or the like. For example, the control circuit 120 could be implemented as a single integrated circuit, whereas the switches S1 and S2, the elements of the output filter 150, and possibly also the clock signal source 170 and/or the reference signal source 180, could be provided as separate components, e.g. using one or more further integrated circuits or discrete circuit elements.

Figure 2:
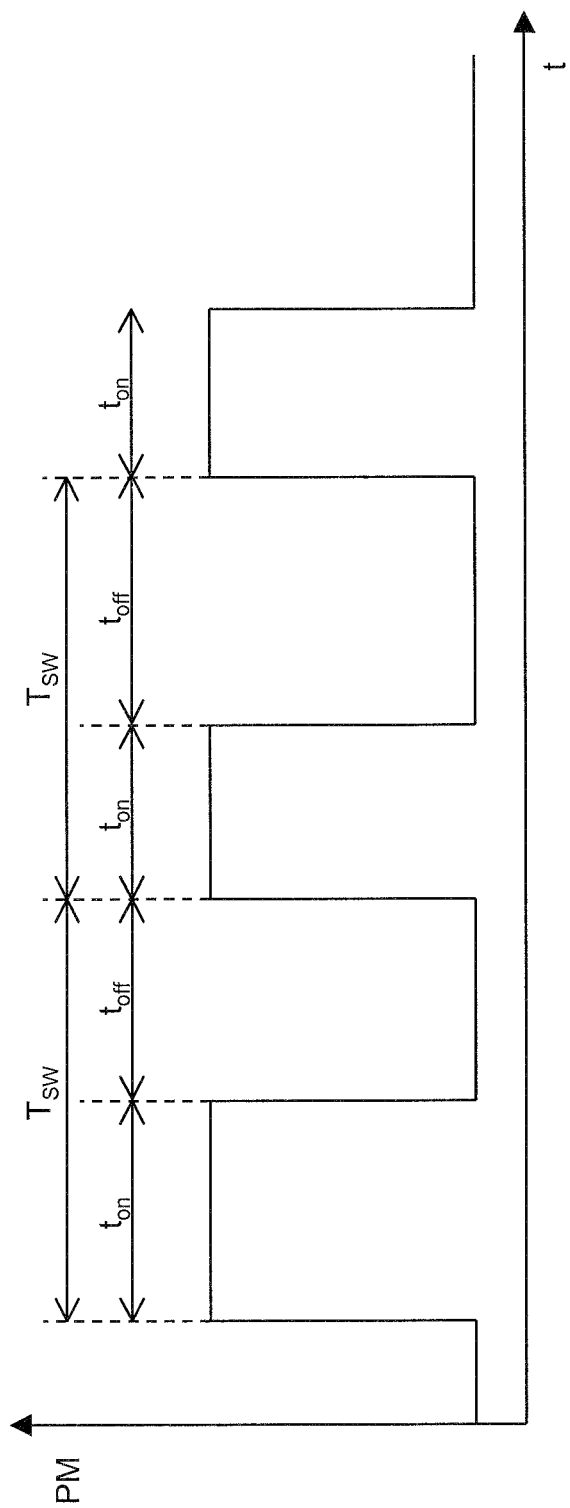
FIG. 2 illustrates a pulse modulated signal as used in an embodiment of the invention.

FIG. 2 schematically illustrates characteristics of the pulse modulated signal PM.

As illustrated, the pulse modulated signal PM is formed of a sequence of pulses. The pulses are due to the pulse modulated signal switching between a low state, e.g. corresponding to the intermediate node 114 being coupled to the reference node 112, and a high state, e.g. corresponding to the intermediate node 114 being coupled to the signal input 110. As mentioned above, the transitions in the pulse modulated signal PM are resulting from the switching operation of the switches S1 and S2 as controlled by the switching signals HS and LS.

As shown in FIG. 2, a pulse period of the pulse modulated signal begins with a signal transition from the low state to the high state, which corresponds to the first switch S1 being closed and the second switch S2 being opened. The pulse width modulated signal PM remains in the high state for a first time period, denoted by $t_{on}$, after which there is a signal transition from the high state to the low state. The pulse modulated signal PM then remains in the low state for a second time period, denoted by $t_{off}$, after which the next pulse period begins with a signal transition from the low state to the high state. The period of the pulse modulated signal PM is thus given by:

$$T_{SW} = t_{on} + t_{off} \quad (1)$$

With this, the frequency of the pulse modulated signal PM can be expressed as:

$$f_{PM} = \frac{1}{T_{SW}}, \quad (2)$$

and the duty cycle of the pulse modulated signal PM can be expressed as:

$$d = \frac{t_{on}}{T_{SW}}. \quad (3)$$

According to the concepts as described herein, different ways may be used to control the process of generating the pulse modulated signal PM. For example, the frequency $f_{PM}$ and period $T_{SW}$ of the pulse modulated signal PM may be substantially constant, and the first time period $t_{on}$ and the second time period $t_{off}$ may be varied, thereby varying the duty cycle d. This corresponds to the pulse modulated signal PM being a pulse width modulated signal. According to a further example, either the first time period $t_{on}$ or the second time period $t_{off}$ may be substantially constant, and the frequency $f_{pm}$ may be varied, thereby varying the duty cycle d. This corresponds to the pulse modulated signal PM being a pulse frequency modulated signal. According to a still further example, the first time period $t_{on}$, the second time period $t_{off}$ and the frequency $f_{pm}$ may be varied.

Some of the above-mentioned mechanisms of adjusting a pulse modulation control parameter typically act on the next or later pulse period of the pulse modulated signal PM. For example, if at a given point of time a new pulse duration, given by the first time period $t_{on}$ is determined, the new pulse duration will be applied to the next or a later pulse period of the pulse modulated signal PM.

In addition, according to the concepts as explained herein, further mechanisms of adjusting a pulse modulation parameter may be applied which take effect already in the ongoing pulse period of the pulse modulated signal. For example, the duration of an ongoing pulse may be extended or may be shortened. Extending the duration of an ongoing pulse may be accomplished by delaying the end of the first time period $t_{on}$. Shortening the duration of an ongoing pulse may be accomplished by forcing an earlier end of the first time period $t_{on}$. Both actions may be obtained by introducing a selectively controllable delay before the switching operation causing the signal transition at the end of the first time period $t_{on}$. More specifically, three different delays could be selectively used: a first small delay, e.g. a delay of substantially zero, corresponding to the forced earlier end of the first time period $t_{on}$, a second medium delay corresponding to the nominal end of the first time period $t_{on}$, and a third large delay corresponding to the delayed end of the first time period $t_{on}$. Further, the frequency of the pulse modulated signal PM may be adjusted by extending or shortening the second time period $t_{off}$ of the ongoing pulse period.

In the following, embodiments of the control circuit 120 will be explained in more detail. As mentioned above, these embodiments are based on concurrently controlling two different pulse modulation control parameters.

Figure 3:
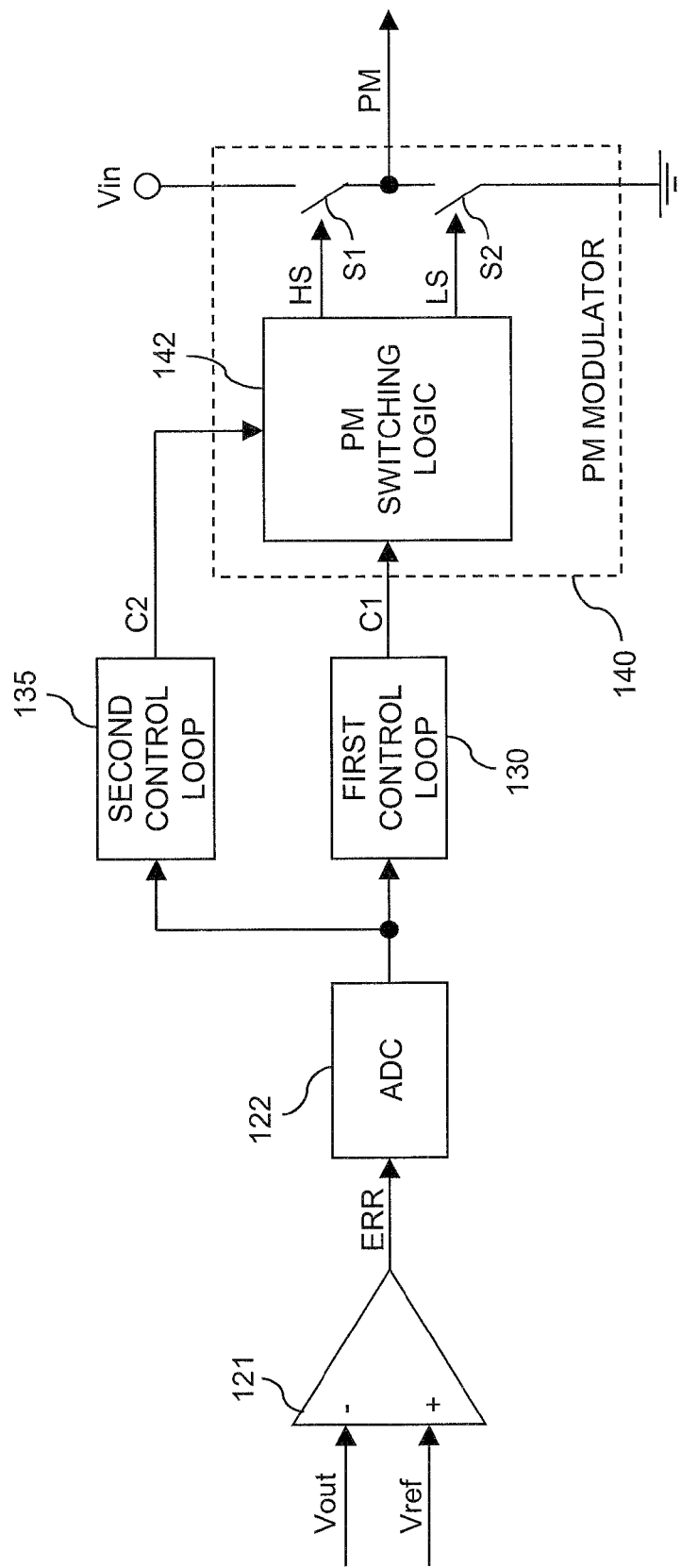
FIG. 3 schematically illustrates a control circuit according to an embodiment of the invention.

FIG. 3 schematically illustrates an exemplary implementation of the control circuit 120. As illustrated, the control circuit includes an error detector 121, an analog-to-digital converter (ADC) 122, a first control loop 130, a second control loop 135, and a pulse modulation (PM) switching logic 142. In addition, FIG. 3 also shows the switches S1 and S2. Together with the switches S1 and S2, the pulse modulation switching logic 142 forms a pulse modulator 140. In accordance with the above mentioned concepts, the first and second control loops are used to generate a first control signal C1 and a second control signal C2, respectively, using of feedback on the basis of the output signal of the DC DC converter circuit 100, and the first and second control signals C1 and C2 are used to concurrently adjust different pulse modulation parameters.

The error detector 121, which may be implemented on the basis of a differential amplifier, receives the output signal of the DC-DC converter circuit 100, i.e. the DC voltage Vout, and the reference signal from the reference signal source, i.e. the reference voltage Vref. On the basis of the output signal and the reference signal, the error detector 121 generates an error signal ERR. For example, the error signal may be an analog signal having a value which is representative of the difference between the output signal and the reference signal.

The analog-to-digital converter 122 receives the error signal ERR from the error detector 121 and generates digital samples therefrom. The sampling rate of the digital-to-analog converter 122 may be determined by the frequency of the clock signal CLK supplied to the control circuit 120. According to some embodiments, the sampling rate of the analog-to-digital converter 122 is selected to be the nominal frequency of the pulse modulated signal PM, multiplied by an oversampling factor, e.g. of two. In this way, multiple samples of the error signal ERR can be obtained with respect to a single pulse period. The samples of the error signal ERR are supplied in parallel to the first control loop 130 and to the second control loop 135.

The first control loop 130 generates the first control signal C1 from the samples of the error signal ERR. The first control signal C1 is supplied to the pulse modulation switching logic 142 so as to control a first pulse modulation control parameter. The second control loop 130 generates the second control signal C2 from the samples of the error signal ERR. The second control signal C2 is supplied to the pulse modulation switching logic 142 so as to control a second pulse modulation control parameter concurrently with the first pulse modulation control parameter. By concurrently controlling different pulse modulation control parameters, the control circuit 120 can be adapted to handle certain operation conditions of the DC-DC converter circuit 100 in a favorable manner, such as abrupt load changes at the signal output 160, disturbances in the input signal, or mode changes, e.g. from pulse frequency modulation operation to pulse width modulation operation. For this purpose, the first and second control loops 130, 135 may also be based on different control algorithms, e.g. control algorithms having different control response times. Moreover, it is to be understood that in some embodiments at least one of the control loops 130, 135 may be analog. Depending on the implementation of the control loops 130, 135, the analog-to-digital converter 122 may be omitted or placed in one of the control loops 130, 135. Further, in some embodiments each of the control loops 130, 135 may be provided with a respective analog-to-digital converter, e.g. at the input of the control loop 130, 135 or at the output of the control loop 130, 135.

Moreover, it is to be understood, that in some embodiments the first and second control loops 130, 135 could be configured to operate using feedback on the basis of the output signal, but be supplied with different input signals, rather than operating on the basis of the same input signal, i.e. the error signal ERR. For example, only the first control loop 130 could use the error signal ERR as its input signal, and the second control loop could use an input signal derived in a different manner, e.g. derived from a current through the coil of the inductor 152 in the output filter 150 or derived from the output voltage Vout without passing the error detector 121. These and other ways to derive a feedback signal reflecting characteristics of the output signal in a desirable manner so to be used as input signal for one or both of the control loops 130, 135.

Figure 4:
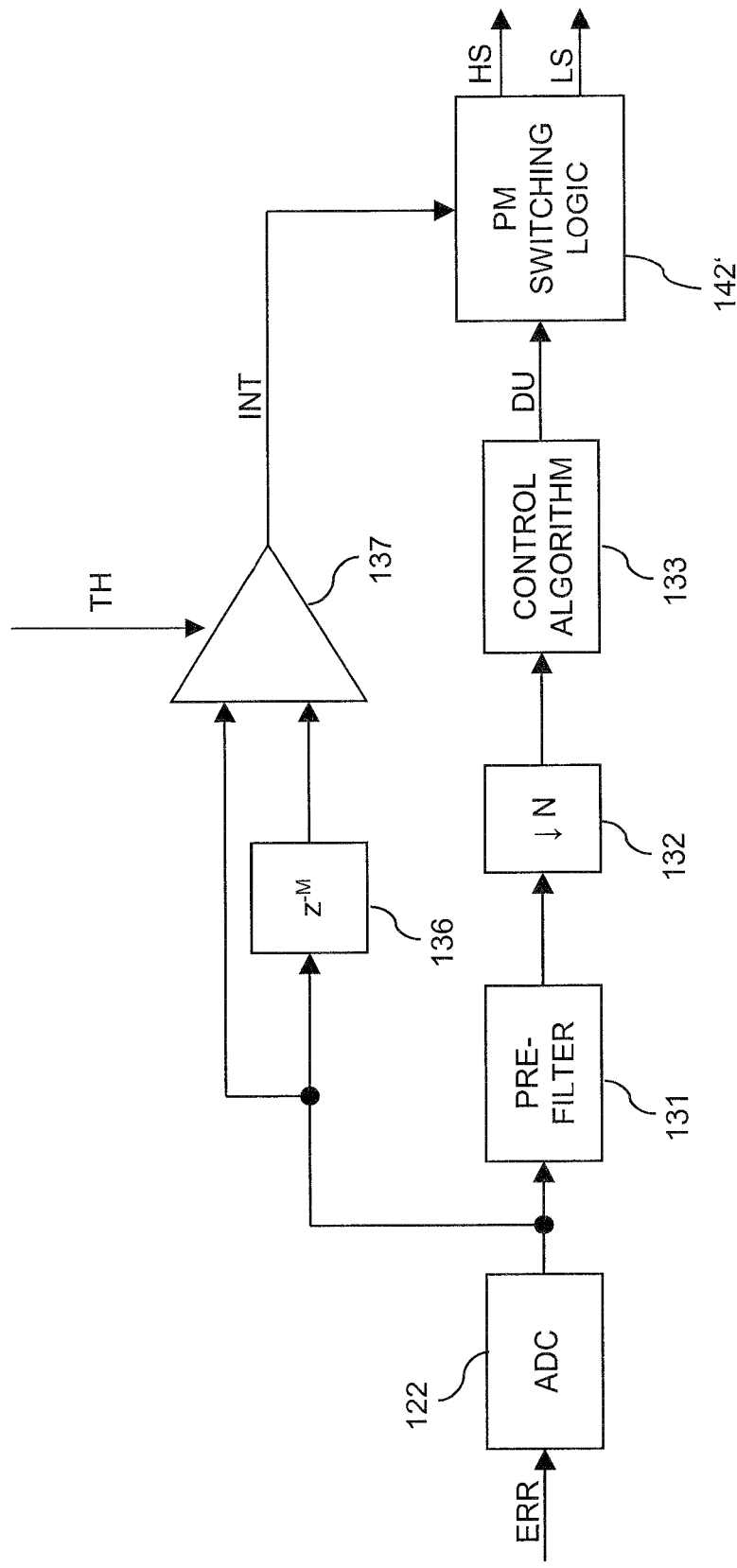
FIG. 4 schematically illustrates a control circuit according to a further embodiment of the invention.

FIG. 4 schematically illustrates a further exemplary implementation of the control circuit 120. Components which are similar to those of FIG. 3 have been designated with the same reference signs and for details concerning these components reference is made to the corresponding explanations in connection with FIG. 3. As illustrated, the implementation of the control circuit 120 includes an analog-to-digital converter 122, a first control loop with a prefilter 131, a downsampler 132, and a control algorithm 133, and a second control loop with a register 136 and a comparator 137. Further, the implementation of the control circuit 120 includes a pulse modulation switching logic 142' operating on the basis of a duty cycle control signal DU and an interrupt signal INT. The error detector 121 and the switches S1 and S2 are not illustrated in FIG. 4, but it is to be understood that these components may be present as well.

In the first control loop of FIG. 4, the samples of the error signal ERR are received by the prefilter 131. Different types of filter characteristics may be used in the prefilter 131, e.g. a low-pass filter characteristic or a bandpass filter characteristic. In some embodiments, the prefilter 131 may be omitted.

The downsampler 132 receives the, typically prefiltered, samples of the error signal ERR. In the downsampler 132, the samples of the error signal are resampled to a lower sampling rate. In some embodiments, the downsampler 132 may be omitted, e.g. if the sampling rate of the analog-to-digital converter 121 is already suitable to be used in the control algorithm 133. According to some embodiments, at least two samples of the error signal ERR are generated per pulse period of the pulse modulated signal PM, and the downsampler 132 reduces the sampling rate to one sample per pulse period of the pulse modulated signal PM.

The control algorithm 133 receives the, typically prefiltered and downsampled samples, of the error signal ERR and generates the duty cycle control signal DU therefrom. According to some embodiments, the pulse modulated signal PM is a pulse width modulated signal and the duty cycle control signal DU controls the duty cycle of the pulse width modulated signal by adjusting the pulse duration. According to other embodiments, the pulse modulated signal PM is a pulse frequency modulated signal and the duty cycle control signal DU controls the duty cycle of the pulse frequency modulated signal by adjusting the frequency. The control algorithm 133 may be of the proportional-integral-derivative (PID) type, either linear or nonlinear. Other types of control algorithm may be used as well.

The second control loop of FIG. 4 is configured to detect a transient in the error signal ERR. According to the illustrated embodiment, this is accomplished by storing a first sample of the error signal ERR in the register 136, and by comparing, using the comparator 137, the stored first sample to a second sample of the error signal ERR. Here, it is to be understood that, due to storage in the register, the first and second sample of the error signal ERR will be delayed with respect to each other, e.g. by one or more clock cycles of the clock signal CLK, as indicated by the transfer function $z^{-M}$, in which M may be 1, corresponding to a delay of one clock cycle, or a larger integer. If the deviation between the first and second sample exceeds a threshold value, in FIG. 4 indicated by a threshold input TH to the comparator 137, a transient is detected, which is indicated to the pulse modulation switching logic 142' by the interrupt signal INT. In some embodiments, the second control loop may be configured to distinguish between a positive and a negative transient and to indicate the type of transient in the interrupt signal. In some embodiments, also a magnitude of the transient may be indicated in the interrupt signal INT. In other embodiments only one type of transient, i.e. either positive or negative, may be detected an indicated by the interrupt signal.

According to some embodiments, the first and the second sample are obtained with respect to the same pulse period of the pulse modulated signal. More specifically, the first sample may be obtained at the beginning of the pulse period (or at the end of the previous pulse period), and the second sample may be obtained a predefined time interval before the intended end of the ongoing pulse of the pulse modulated signal. For example, the sampling points of the analog-to-digital converter 122 may be suitably time-correlated to the switching operations controlled by the pulse modulation switching logic 142'. In some embodiments, the second sample may be obtained immediately before the intended end of the ongoing pulse, e.g. just before the pulse modulation switching logic 142' generates the switching signals HS and LS to open the first switch S1 and to close the second switch S2. According to other embodiments, the sampling points for obtaining the first and second samples may be equidistantly spaced. Further, it is to be understood that more than two samples per pulse period could be used as well.

The pulse modulation switching logic 142' receives the duty cycle control signal DU, which is used to adjust the duty cycle of the next pulse period of the pulse modulated signal PM. As mentioned above, this may be accomplished using pulse width modulation or pulse frequency modulation. In response to the interrupt signal INT indicating a detected transient, the duration of an ongoing pulse of the pulse modulated signal PM is adjusted by an adjustment value, which may be predefined. According to some embodiments, the adjustment value may depend on certain operating conditions. As an alternative or in addition, the duration of the ongoing pulse may be shortened by an adjustment value which may again be predefined and/or depend on certain operating conditions. In some embodiments, whether to extend or shorten the ongoing pulse may be determined depending on the type of the transient indicated in the interrupt signal INT, e.g. on the transient being positive or negative. In this connection, it is to be noted that shortening of the ongoing pulse is only possible if the transient is detected sufficiently early during the pulse. Extending the ongoing pulse is possible even if the transient is detected at the very end of the ongoing pulse. In other embodiments, the duration of the ongoing pulse may be extended/shortened by an adjustment value which depends on the magnitude of the detected transient, e.g. by determining the value from the magnitude using a control algorithm of the proportional type (P-type), of the proportional-derivative type (PD-type), or of the proportional-integral-derivative type (PID-type).

Similar to the control circuit implementation of FIG. 3, it is to be understood that the first and second control loops in FIG. 4 could each operate on the basis of an input signal which is different from the illustrated error signal ERR, e.g. derived from the output signal of the DC-DC converter circuit 100 in a different manner.

Figure 5:
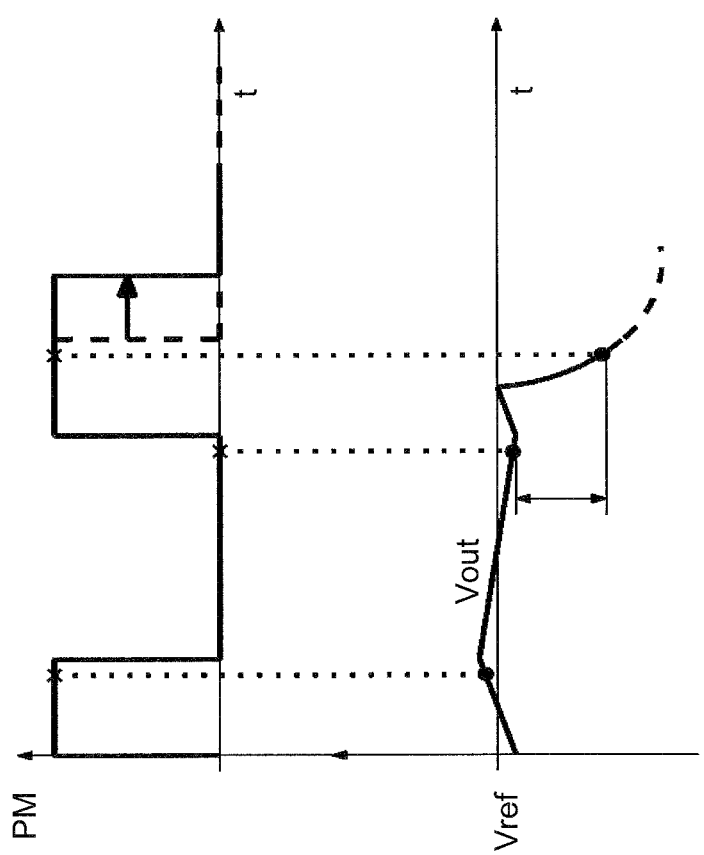
FIG. 5 illustrates an exemplary pulse modulation control operation of the control circuit as illustrated in FIG. 4.

FIG. 5 illustrates an exemplary pulse modulation control operation of the control circuit as illustrated in FIG. 4. More specifically, FIG. 5 illustrates exemplary courses of the pulse modulated signal PM and the output signal Vout in response to an undershoot in the output signal Vout. The sampling points of the error signal ERR are illustrated by dotted vertical lines, and comparative courses of the pulse modulated signal PM and of the output voltage Vout without acting on the pulse duration of the ongoing pulse is illustrated by dashed lines. Here it should be noted that the error signal ERR itself is not illustrated in FIG. 5, but can be assumed to show a similar behavior as the output signal Vout, possibly with inverted sign and scaled by a factor.

As can be seen from the illustration of FIG. 5, the first sampling point is at the beginning of the pulse period, in particular shortly before the signal transition of the pulse modulated signal PM from the high state to the low state. The second sampling point is during the pulse, in particular shortly before the intended end of the pulse. Here, it is to be understood that the intended end of the pulse may be controlled by the duty cycle control signal DU according to the above-mentioned pulse-width nodulation technique and determined on the basis of the samples of the error signal ERR obtained during the previous pulse period.

During the first pulse in the pulse modulated signal PM as illustrated in FIG. 5, no transient is detected and the output signal Vout, and the transition in the pulse modulated signal PM occurs as intended. During the second pulse in the pulse modulated signal PM as illustrated in FIG. 5, the deviation between the first and second sample of the error signal ERR, illustrated by a vertical double headed arrow, exceeds the threshold value, and a transient is detected by the second control loop. In the illustrated example, the deviation between the first and second sample of the error signal ERR is due to an undershoot in the output signal Vout, e.g. resulting from an abrupt increase in the load on the signal output 160 of the DC-DC converter circuit 100. The detected transient is indicated by means of the interrupt signal INT. In some embodiments, the interrupt signal INT may also indicate the magnitude of the detected transient, e.g. the deviation of the output signal Vout from its nominal value or the deviation between two samples of the error signal. In response to the interrupt signal INT, the pulse modulation switching logic 142' delays the switching operation for causing the signal transition of the pulse modulated signal PM from the high state to the low state by an adjustment value, which may in turn depend on the operating conditions of the DC-DC converter circuit 100, e.g. on the frequency of the pulse modulated signal PM or on the nominal value of the output voltage Vout, or on the magnitude of the transient. By delaying the switching operation, the duration of the ongoing pulse, during which the transient is detected, is increased. The increase in the duration of the ongoing pulse counteracts the undershoot in the output signal Vout.

It is to be understood that a control process similar to that as illustrated in FIG. 5 could also be used to counteract an overshoot in the output signal Vout, which can be detected as a transient of opposite sign in the error signal ERR. If this type of transient is detected sufficiently early during the pulse, e.g. at about half of the intended pulse duration, the ongoing pulse can be shortened by causing the transition of the pulse modulated signal PM from the high state to the low state to occur earlier, e.g. by an adjustment value which may depend on the operating conditions of the DC-DC converter circuit 100, e.g. on the frequency of the pulse width modulated signal PM, on the desired value of the output voltage Vout, or on the magnitude of the detected transition, which may be indicated by the interrupt signal INT as well, or by causing the transition to occur immediately in response to the interrupt signal INT indicating the detected transient.

Figure 6:
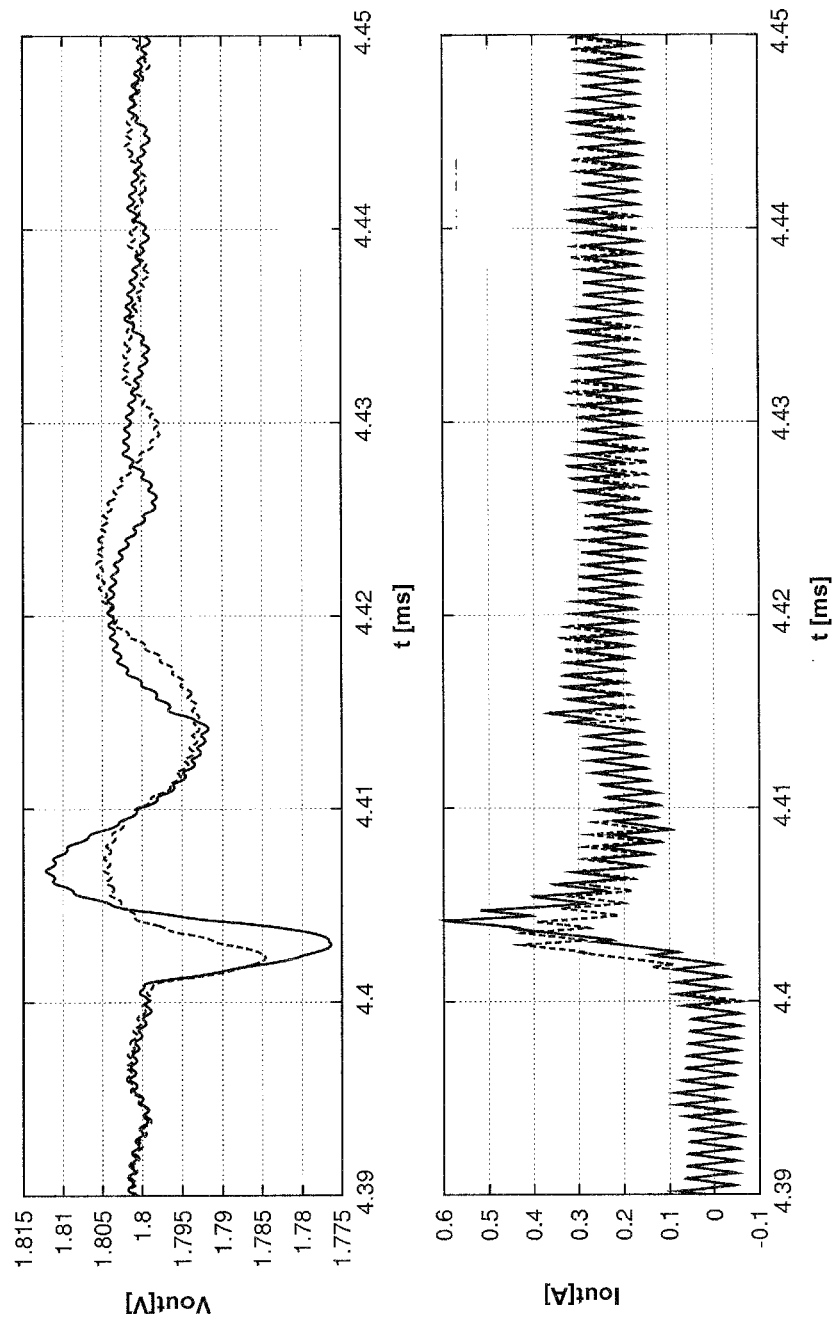
FIG. 6 shows exemplary simulation results on a DC-DC converter circuit implemented with a control circuit as illustrated in FIG. 4.
Figure 7:
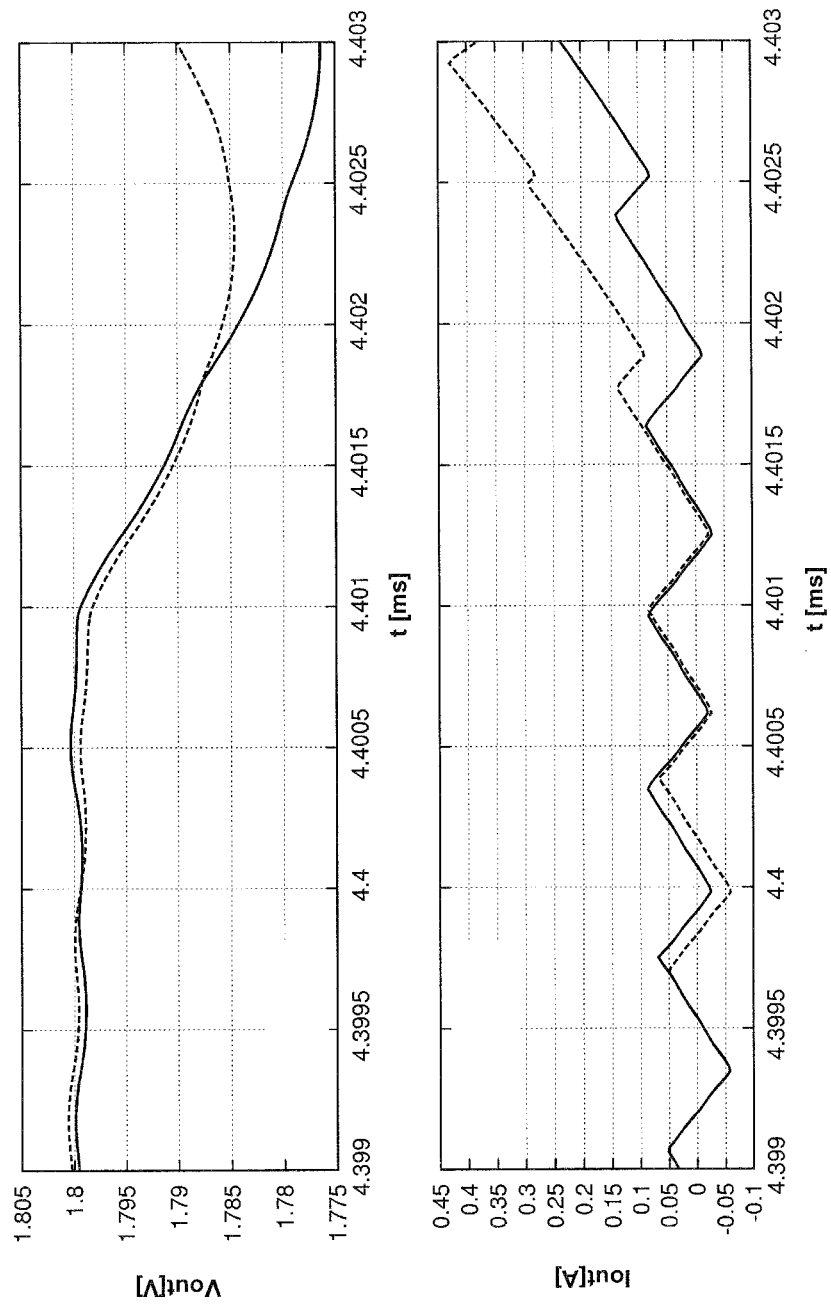
FIG. 7 shows further exemplary simulation results on a DC-DC converter circuit implemented with a control circuit as illustrated in FIG. 4.

FIGS. 6 and 7 show exemplary simulation results representing the output voltage Vout and the output current Iout of a DC-DC converter circuit as illustrated in FIG. 1 and using a control circuit implementation as illustrated in FIG. 4. In the simulations, it was assumed that the load on the signal output of the DC-DC converter circuit increases at about t=4.4 ms. The nominal output voltage was assumed to be 1.8 V. The dashed line shows the signal course for pulse width modulation with the control circuit implementation of FIG. 4, and the solid line a comparative simulation for pulse width modulation without acting the duration of the ongoing pulse.

As can be seen, the control circuit implementation of FIG. 4 significantly reduces the undershoot in the output voltage Vout, and also reduces subsequent overshoot due to the control reaction.

Figure 8:
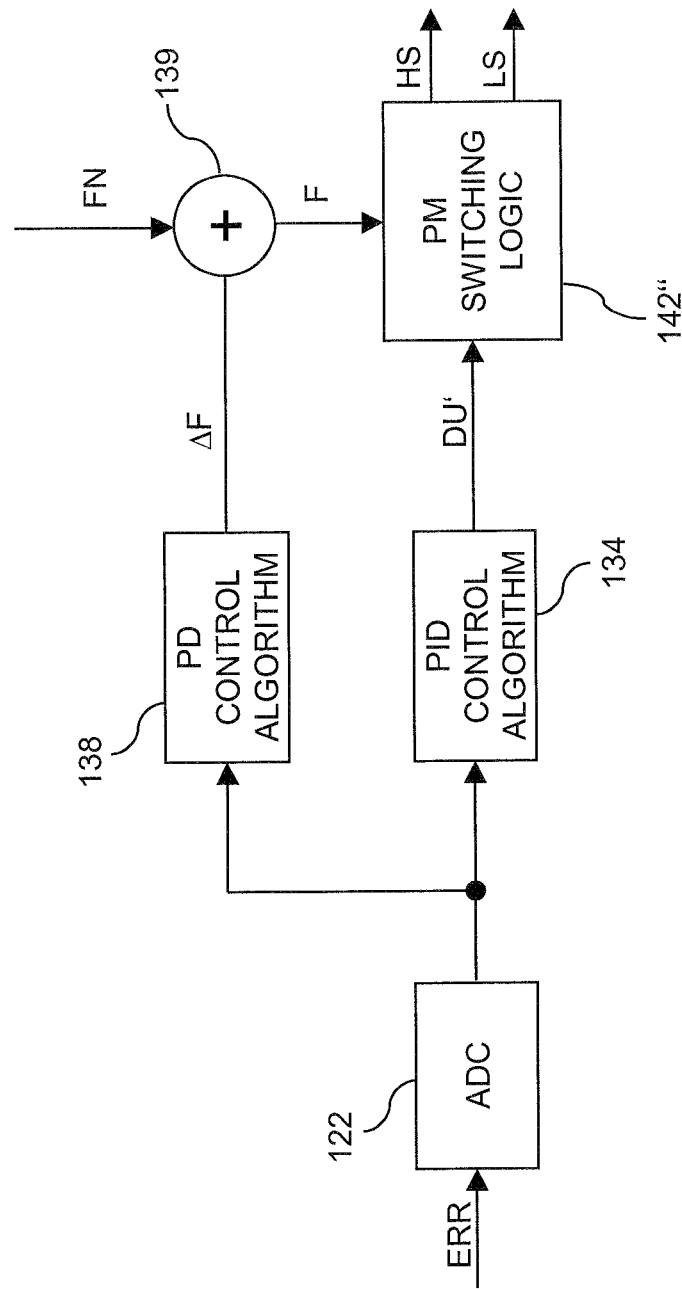
FIG. 8 schematically illustrates a control circuit according to a further embodiment of the invention.

FIG. 8 schematically illustrates a further exemplary implementation of the control circuit 120. Components which are similar to those of FIG. 3 have been designated with the same reference signs and for details concerning these components reference is made to the corresponding explanations in connection with FIG. 3. As illustrated, the implementation of the control circuit 120 includes an analog-to-digital converter 122, a first control loop with a first control algorithm 134, and a second control loop with a second control algorithm 138 and a summation node 139. Further, the implementation of the control circuit 120 includes a pulse modulation switching logic 142" operating on the basis of a pulse duration control signal DU' and frequency control signal F. The error detector 121 and the switches S1 and S2 are not illustrated in FIG. 8, but it is to be understood that these components may be present as well.

In the example illustrated in FIG. 8, the first control algorithm 138 is of the PID type, either linear or non-linear, and the second control algorithm 138 is of the proportional-derivative (PD) type, either linear or non-linear. In this respect, it is to be understood that the control algorithm 138 of the PD type may also be regarded as a control algorithm of the PID type, in which the integral control contribution is substantially zero. In this way, a control response time of the second control loop is shorter than a control response time of the first control loop. In other embodiments the control response time of the second control loop being shorter than that of the first control loop can be achieved in a different manner. For example, the first control algorithm 134 and the second control algorithm 138 may both be of the PID type, with the integral control contribution of the second control algorithm 138 being smaller than the integral control contribution of the first control algorithm 134. Other types of control algorithm may be used as well.

The first control algorithm 134 receives the samples, of the error signal ERR from the analog-to-digital converter 122 and generates the pulse duration control signal DU' therefrom. The pulse duration control signal DU' controls the duty cycle of the pulse modulated PM signal by adjusting the pulse duration.

The second control algorithm 138 receives the samples, of the error signal ERR from the analog-to-digital converter 122 and generates a frequency adjustment value ΔF therefrom. In the summation node 139, the frequency adjustment signal ΔF is added to a nominal frequency value FN, thereby generating the frequency control signal F. When using a PID type implementation the second control algorithm with non-zero integral control contribution, the summation node 139 may be omitted or the nominal frequency value FN may be set to zero. The frequency control signal F is supplied to the pulse modulation switching logic 142" to control the frequency of the pulse modulated signal PM concurrently with its pulse duration.

The pulse modulation switching logic 142" receives the pulse duration control signal DU', which is used to adjust the pulse duration of the pulse modulated signal PM. More specifically, if the error signal ERR indicates that the output signal is too small, the pulse duration of the pulse modulated signal PM may be increased, and if the error signal ERR indicates that the output signal is too large, the pulse duration of the pulse modulated signal PM may be decreased. Further, the pulse modulation switching logic 142" receives the frequency control signal F, which is used to adjust the frequency of the pulse modulated signal PM, e.g. by setting the period $T_{SW}$ of the pulse modulated signal PM. More specifically, if the error signal ERR indicates that the output signal is too small, the frequency of the pulse modulated signal PM may be increased, and if the error signal ERR indicates that the output signal is too large, the frequency of the pulse modulated signal PM may be decreased. According to some embodiments, referring to the first time period $t_{on}$ and the second time period $t_{off}$ as explained in connection with FIG. 2, the pulse duration control signal DU' may be used to set the first time period $t_{on}$, and the frequency control signal may be used to set the second time period $t_{off}$.

By concurrently controlling the pulse duration and the frequency in response to the error signal ERR, the control circuit implementation provides a fast reaction to load changes at the signal output of the DC-DC converter circuit 100. During steady-state operation, the control action causes the pulse modulated signal PM to be generated as a pulse width modulated signal with a predefined frequency, i.e. the nominal frequency. If there is a transient in the output signal, e.g. caused by an abrupt positive or negative change of the load on the signal output of the DC-DC converter circuit 100, the frequency is increased or decreased, respectively, which accelerates recovery of the output signal from the disturbance. When the output signal has recovered from the disturbance, the frequency returns to its nominal value.

Similar to the control circuit implementation of FIG. 3, it is to be understood that the first and second control loops in FIG. 4 could each operate on the basis of an input signal which is different from the illustrated error signal ERR, e.g. derived from the output signal of the DC-DC converter circuit 100 in a different manner.

Figure 9:
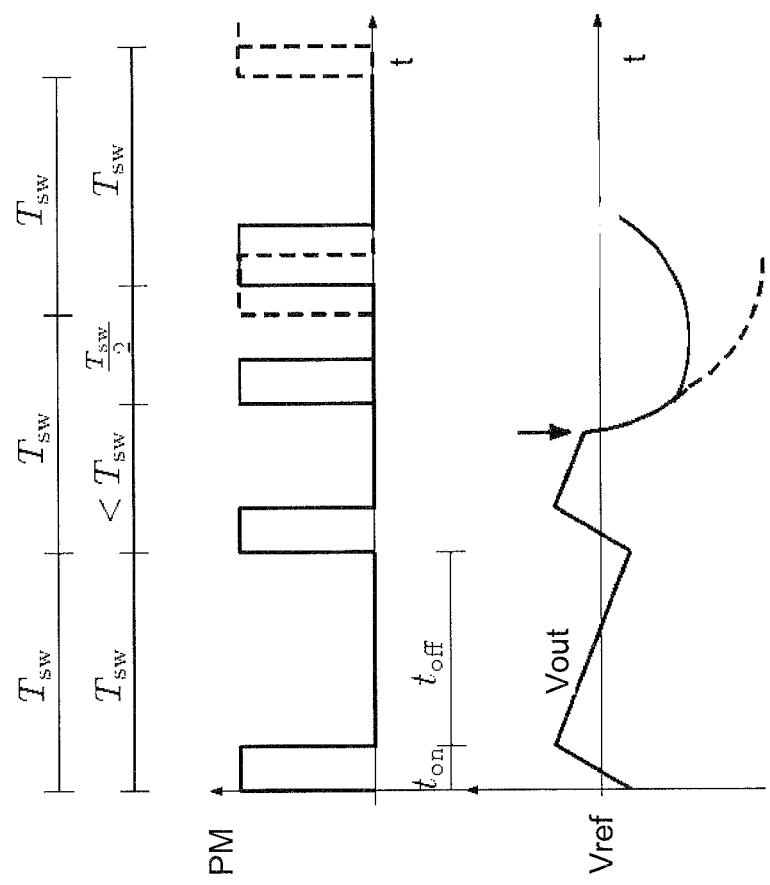
FIG. 9 illustrates an exemplary pulse modulation control operation of the control circuit as illustrated in FIG. 8.

FIG. 9 illustrates an exemplary pulse modulation control operation of the control circuit as illustrated in FIG. 8. More specifically, FIG. 9 illustrates exemplary courses of the pulse modulated signal PM and the output signal Vout in response to an undershoot in the output signal Vout. Comparative courses of the pulse modulated signal PM and of the output voltage Vout without acting on the frequency of the pulse modulated signal PM are illustrated by dashed lines. The error signal ERR itself is not illustrated in FIG. 9, but can be assumed to show a similar behavior as the output signal Vout, possibly with inverted sign and scaled by a factor.

FIG. 9 illustrates a situation in which the duty cycle to produce the output signal is low. One example of operating conditions resulting in such a situation is when the difference between the input signal and the nominal value of the output signal is high (e.g. Vin=12-21 V, Vout=1 V). Such configurations may for example arise in DC-DC converter circuits of the Point-of-Load type. In such a situation, it is likely that a load change occurs in the second time period $t_{off}$ of the pulse period.

During the first pulse in the pulse modulated signal PM as illustrated in FIG. 9, there is no transient in the output signal Vout, and the period $T_{SW}$ of the pulse modulated signal is left unchanged, corresponding to the nominal frequency. During the second pulse in the pulse modulated signal PM as illustrated in FIG. 9, there is an abrupt increase in the load, which is indicated by a vertical arrow, causing an undershoot in the output signal Vout. The second control loop detects the undershoot in the output signal Vout, and adjusts the frequency control signal F so as to increase the frequency of the pulse modulated signal PM from its nominal value. This can be done during the ongoing pulse period by shortening the second time period $t_{off}$. The increased frequency causes an increase in the duty cycle of the pulse modulated signal PM, which counteracts the undershoot in the output signal Vout.

According to some embodiments, the possible variation of the frequency in response to the frequency control signal F is limited to a minimum value and/or a maximum value. For example, the maximum variation of the period $T_{SW}$ could be between $T_{SW}/2$ and $2 T_{SW}$. Depending on requirements of the intended application, other limitations may be used as well.

It is to be understood that a control process similar to that as illustrated in FIG. 9 could also be used to counteract an overshoot in the output signal Vout. In response to an overshoot the frequency of the pulse modulated signal PM may then be decreased, which can be done during the ongoing pulse period by extending the second time period $t_{off}$.

Figure 10:
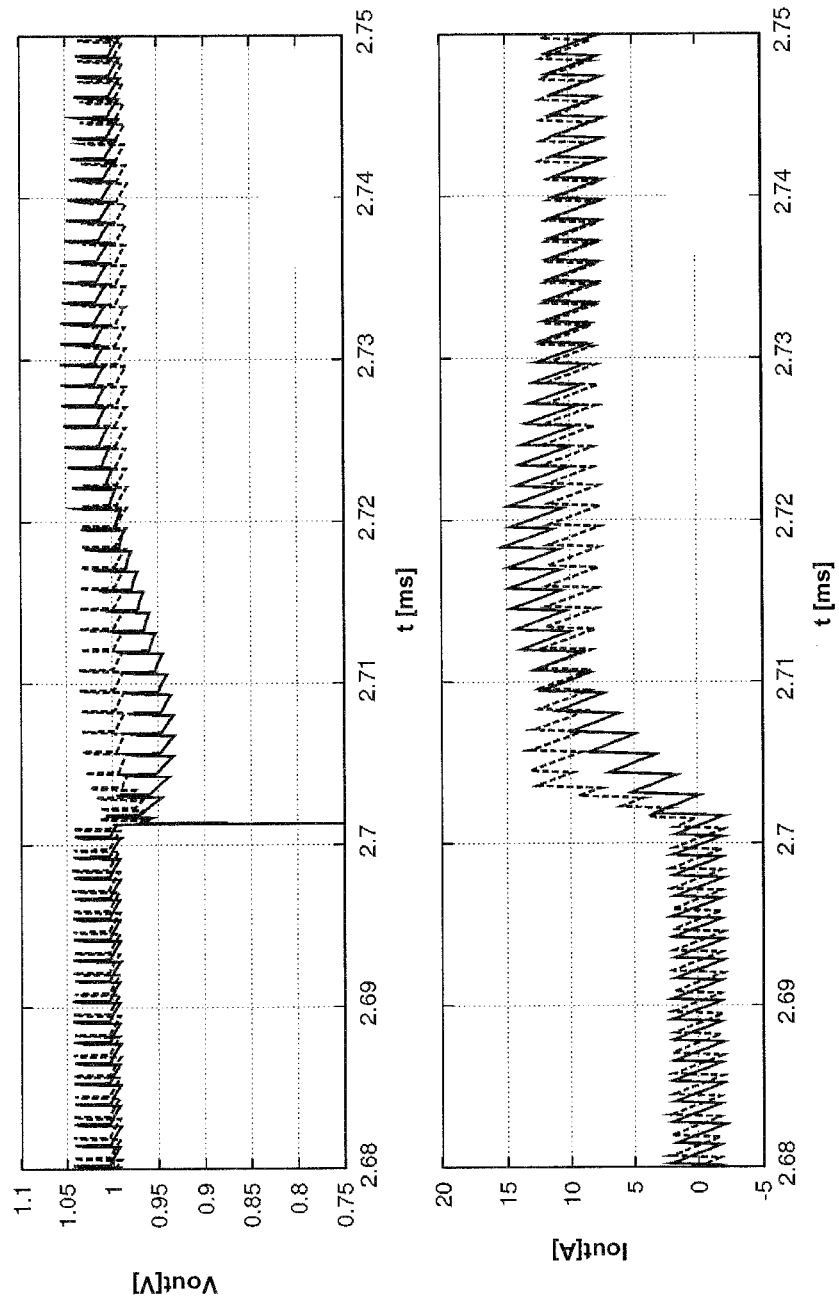
FIG. 10 shows exemplary simulation results on a DC-DC converter circuit implemented with a control circuit as illustrated in FIG. 8.
Figure 11:
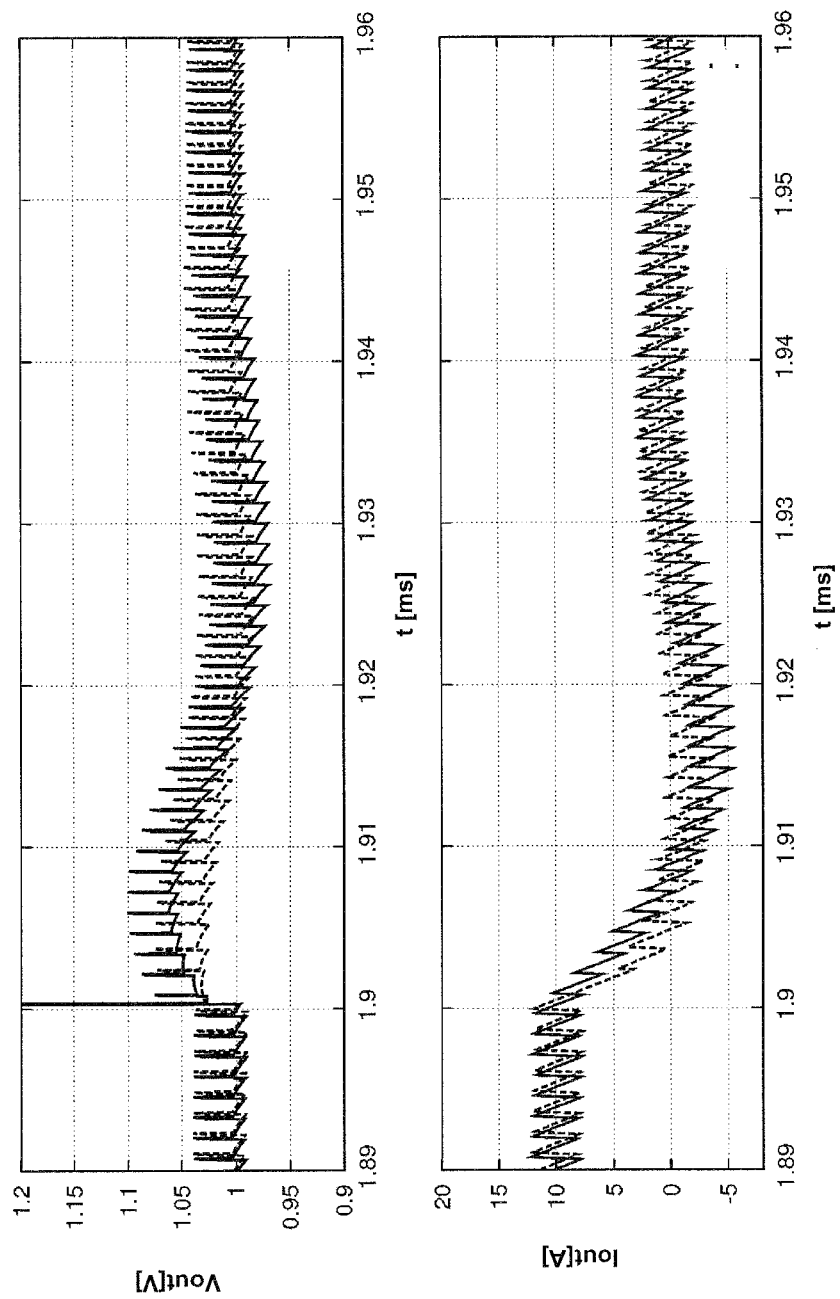
FIG. 11 shows further exemplary simulation results on a DC-DC converter circuit implemented with a control circuit as illustrated in FIG. 8.

FIGS. 10 and 11 show exemplary simulation results representing the output voltage Vout and the output current Iout of a DC-DC converter circuit 100 as illustrated in FIG. 1 and using an implementation of the control circuit 120 as illustrated in FIG. 8. In the simulation of FIG. 10, it was assumed that the load on the signal output 160 of the DC-DC converter circuit 100 increases from 100 mA to 10 A at about t=2.7 ms. In the simulation of FIG. 11, it was assumed that the load on the signal output 160 of the DC-DC converter circuit 100 decreases from 10 A to 100 mA at about t=1.9 ms. The nominal output voltage was assumed to be 1 V. The dashed line shows the signal course for pulse modulation with the control circuit implementation of FIG. 8, and the solid line a comparative simulation for pulse width modulation without additional control of the frequency.

As can be seen, the control circuit implementation of FIG. 9 significantly reduces the overshoot and undershoot in the output voltage Vout, and also reduces the time the output voltage Vout needs to recover from the disturbance.

It should be noted that the numerical values of the simulation results as shown in FIGS. 6, 7, 10, and 11 serve only for the purpose of further illustrating the concepts according to some embodiments of the present invention and are not to be construed as limiting.

Figure 12:
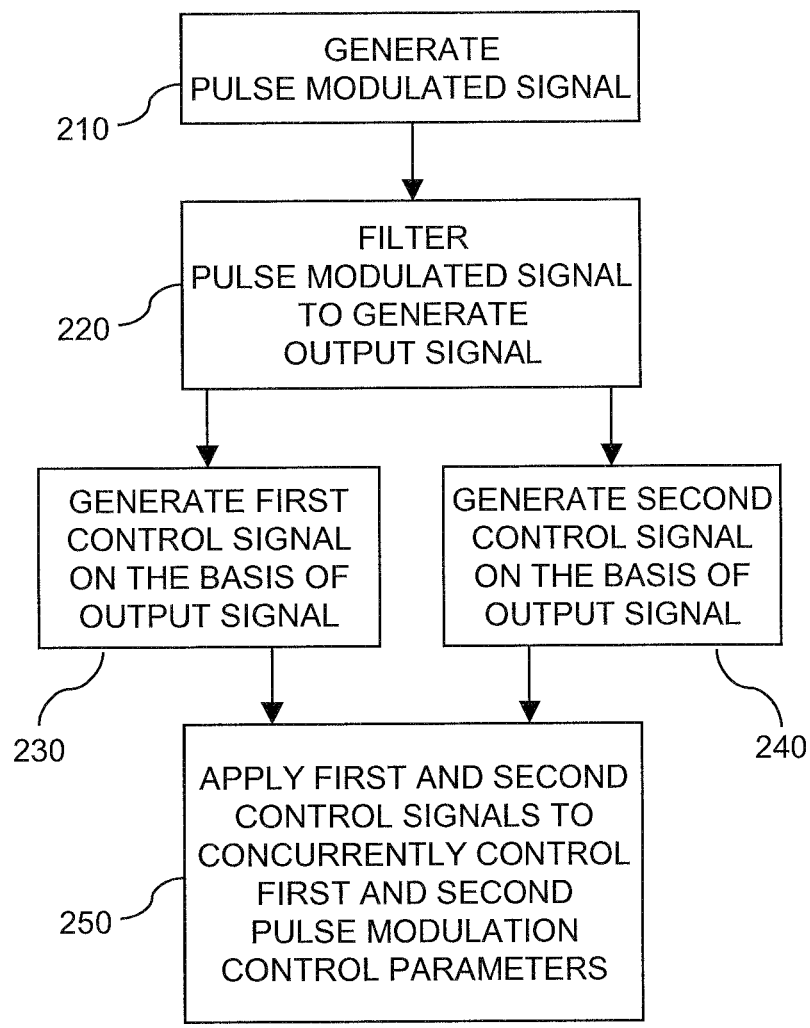
FIG. 12 shows a flowchart for illustrating a method according to an embodiment of the invention.

FIG. 12 shows a flow chart for schematically illustrating a method of pulse modulation control according to an embodiment of the invention. The method may be implemented in a DC-DC converter circuit as explained above.

At step 210, a pulse modulated signal is generated with a first pulse modulation control parameter and a second pulse modulation control parameter. This may be accomplished using a pulse modulation switching logic as explained above, i.e. using the pulse modulation switching logic 142 of FIG. 3, the pulse modulation switching logic 142' of FIG. 4, or the pulse modulation switching logic 142" of FIG. 9. According to some embodiments, the pulse modulated signal may be generated as a pulse width modulated signal having a substantially constant frequency or as a pulse frequency modulated signal having a substantially constant pulse duration. The pulse modulated signal may be generated by pulse modulation of a DC input signal, e.g. the DC input voltage Vin as explained in connection with FIG. 1. According to some embodiments, the first pulse modulation control parameter may be the duty cycle of the pulse modulated signal, and the second pulse modulation parameter may be the duration of an ongoing pulse of the pulse modulated signal. According to some embodiments, the first pulse modulation parameter may be the pulse duration of the pulse modulated signal, and the second pulse modulation parameter may be the frequency of the pulse modulation parameter.

At step 220, the pulse modulated signal is filtered, thereby obtaining a filtered output signal. This can be accomplished by means of the output filter 150 as illustrated in FIG. 1. By suitably selecting the filtering characteristic, the output signal can be obtained as a DC signal, e.g. the DC output voltage Vout as explained in connection with FIG. 1.

At step 230, a first control signal is generated using feedback on the basis of the output signal. This may be accomplished by means of a first control loop as explained in connection with FIG. 3, 4, or 8. The first control signal may have the purpose of controlling the duty cycle of the pulse modulated signal, e.g. by acting on the pulse duration of the pulse modulated signal or on the frequency of the pulse modulated signal. According to some embodiments, control of the pulse duration has effect on the next or a later pulse period. According to some embodiments, the first control signal may be generated from an error signal which is derived from the output signal. This may be accomplished by means of the error detector 121 as illustrated in FIG. 3. According to some embodiments, the error signal may be obtained by comparing the output signal to a reference signal. For example, if the output signal is a DC voltage, it may be compared to a substantially constant reference voltage, e.g. the reference voltage Vref as generated by the reference signal source 180 of FIG. 1. According to some embodiments, the error signal may be representative of the difference between the output signal and the reference signal.

At step 240, a second control signal is generated using feedback on the basis of the output signal. This may be accomplished by means of a second control loop as explained in connection with FIG. 3, 4, or 8. The second control signal may have the purpose of controlling the duration of an ongoing pulse of the pulse modulated signal or may have the purpose of controlling the frequency of the pulse modulated signal. According to some embodiments, the second control signal indicates a detected transient in the output signal and possibly also the type of the transient, e.g. positive or negative, and/or the magnitude of the transient. According to some embodiments, the second control signal may be generated from an error signal which is derived from the output signal, e.g. the same error signal as used for generating the first control signal or an error signal which is different from that as used for generating the first control signal. This may be accomplished by means of the error detector 121 as illustrated in FIG. 3. According to some embodiments, the error signal may be obtained by comparing the output signal to a reference signal. For example, if the output signal is a DC voltage, it may be compared to a substantially constant reference voltage, e.g. the reference voltage Vref as generated by the reference signal source 180 of FIG. 1. According to some embodiments, the error signal may be representative of the difference between the output signal and the reference signal.

At step 250, the first control signal and the second control signal are applied to concurrently control the first pulse modulation parameter and the second pulse modulation parameter. This may be accomplished by simultaneously supplying the first and second control signals to corresponding control inputs of the pulse modulation switching logic.

It is to be understood that the method as illustrated in FIG. 12 may be subjected to various modifications. For example, method steps may be performed in a different order than illustrated, or two or more method steps may be performed in parallel to each other. By way of example, the steps of generating the first and second control signals could be performed in parallel, i.e. the first and second control signal could be generated substantially simultaneously. Further, it is to be understood that in some embodiments one or more of the illustrated method steps could be omitted and/or one or more additional method steps could be included.

It is to be understood that the above-described embodiments serve only as examples for implementations of concepts according to the present invention, and that these concepts may be applied in various manners which are not restricted to the described embodiments. For example, the concepts of pulse modulation control as described herein may be for generating DC supply signals for various types of electronic devices or components, e.g. processors, transmitters, receivers, or the like. Further, the described pulse modulation control techniques may be used in other applications than DC-DC converters. Moreover, the above-described embodiments are susceptible to various modifications. For example, various types of control algorithms may be implemented in the first and second control loops. The control loops may be analog, digital, or in part digital and in part analog. For example, the first control loop could be digital, and the second control loop could be analog. Further, the first and/or second control loop could include both an analog portion and a digital portion. In analog implementations of the control loop sampling of the error signal by the analog to digital converter may be omitted. Further different types of feedback signals may be used as input signals of the different control loops. Moreover, the described embodiments may be combined with each other as appropriate. For example, a control loop configured to detect a transient as described in connection with FIG. 4 could be used to accomplish frequency control in the second control loop of FIG. 8. Moreover, adjusting the duration of an ongoing pulse as described in connection with FIG. 4 could be used as an additional control mechanism in the embodiment of FIG. 8, e.g. by providing one or more correspondingly configured additional control loop. Accordingly, the concepts as described herein are not confined to using two control loops for concurrently acting on two different pulse modulation control parameters. Rather, an arbitrary number of control loops may be provided for concurrently acting on a corresponding number of different pulse modulation control parameters.

The invention claimed is:

1. A method, comprising:
generating a pulse modulated signal with a first pulse modulation control parameter and a second pulse modulation control parameter;
filtering the pulse modulated signal to generate an output signal;
generating a first control signal on a basis of the output signal;
generating a second control signal on the basis of the output signal; and
applying the first control signal and the second control signal to control the first pulse modulation control parameter and the second pulse modulation control parameter, wherein the first pulse modulation control parameter is a duty cycle of a next pulse period of the pulse modulated signal, and wherein the second pulse control modulation parameter is a duration of an ongoing pulse of the pulse modulated signal.

2. The method according to claim 1, comprising:
detecting a transient in the output signal;
generating the second control signal to indicate a detected transient; and
adjusting the duration of the ongoing pulse by an adjustment value in response to the second control signal indicating the detected transient.

3. A method, comprising:
generating a pulse modulated signal with a first pulse modulation control parameter and a second pulse modulation control parameter;
filtering the pulse modulated signal to generate an output signal;
generating a first control signal on a basis of the output signal;
generating a second control signal on the basis of the output signal; and
applying the first control signal and the second control signal to control the first pulse modulation control parameter and the second pulse modulation control parameter, wherein the first pulse modulation control parameter is a pulsed duration of the pulse modulated signal, and wherein the second pulse modulation control parameter is a frequency of the pulse modulated signal.

4. The method according to claim 3, further comprising increasing or decreasing the frequency of the pulse modulated signal from a nominal value.

5. A device, comprising:
a pulse modulation switching logic configured to generate switching signals of a pulse modulator so as to generate a pulse modulated signal with a duty cycle of a next pulse period of the pulse modulated signal being controlled on a basis of a duty cycle control signal and a duration of an ongoing pulse of the pulse modulated signal being controlled on a basis of an interrupt signal;
a first control loop configured to generate the duty cycle control signal on a basis of an output signal; and
a second control loop configured to generate the interrupt signal in response to detecting a transient in the output signal.

6. A device, comprising:
a pulse modulator to generate a pulse modulated signal with a first pulse modulation control parameter being controlled on a basis of a first control signal and a second pulse modulation control parameter being controlled on the basis of a second control signal;
a first control loop configured to generate the first control signal to control the first pulse modulation control parameter; and
a second control loop configured to generate the second control signal to control the second pulse modulation control parameter, wherein the first pulse modulation control parameter is a duty cycle of a next pulse period of the pulse modulated signal, and wherein the second pulse modulation control parameter is a duration of an ongoing pulse of the pulse modulated signal.

7. The device according to claim 6, wherein the duration of the ongoing pulse is controlled by selectively delaying a switching operation of the pulse modulator.

8. The device according to claim 6, wherein the second control loop is configured to detect a transient in an output signal derived from the pulse modulated signal.

9. The device according to claim 6, wherein a control response time of the second control loop is shorter than a control response time of the first control loop.

10. A device, comprising:
a pulse modulator to generate a pulse modulated signal with a first pulse modulation control parameter being controlled on a basis of a first control signal and a second pulse modulation control parameter being controlled on the basis of a second control signal;
a first control loop configured to generate the first control signal to control the first pulse modulation control parameter; and
a second control loop configured to generate the second control signal to control the second pulse modulation control parameter, wherein the first pulse modulation control parameter is a pulsed duration of the pulse modulated signal, and wherein the second pulse modulation control parameter is a frequency of the pulse modulated signal.

11. The device according to claim 10, wherein the second control loop is configured to increase or decrease the frequency of the pulse modulated signal from a nominal frequency.

12. A device, comprising:
a pulse modulator to generate a pulse modulated signal with a first pulse modulation control parameter being controlled on a basis of a first control signal and a second pulse modulation control parameter being controlled on the basis of a second control signal;
a first control loop configured to generate the first control signal to control the first pulse modulation control parameter; and
a second control loop configured to generate the second control signal to control the second pulse modulation control parameter, wherein the second control loop is configured to detect a transient in an output signal derived from the pulse modulated signal, and wherein the second control loop comprises:
a register configured to store a first sample derived from the output signal, and
a comparator configured to detect the transient on the basis of a deviation between a stored first sample and a second sample derived from the output signal.

13. The device according to claim 12, wherein the transient is detected in response to the deviation between the first sample and the second sample exceeding a threshold value.

14. The device according to claim 12, wherein the first sample is generated at a beginning of a pulse of the pulse modulated signal and the second sample is generated during the pulse of the pulse modulated signal.

15. The device according to claim 14, wherein the second sample is generated a predefined time interval before an intended end of the pulse of the pulse modulated signal.

16. A device, comprising:
a pulse modulator to generate a pulse modulated signal with a first pulse modulation control parameter being controlled on a basis of a first control signal and a second pulse modulation control parameter being controlled on the basis of a second control signal;
a first control loop configured to generate the first control signal to control the first pulse modulation control parameter; and
a second control loop configured to generate the second control signal to control the second pulse modulation control parameter, wherein a pulse modulation switching logic is configured to adjust the second pulse modulation control parameter by an adjustment value in response to the second control signal indicating a detected transient.

17. The device according to claim 16, wherein the adjustment value depends on a magnitude of the detected transient.

18. A device, comprising:
a pulse modulator to generate a pulse modulated signal with a first pulse modulation control parameter being controlled on a basis of a first control signal and a second pulse modulation control parameter being controlled on the basis of a second control signal;
a first control loop configured to generate the first control signal to control the first pulse modulation control parameter; and
a second control loop configured to generate the second control signal to control the second pulse modulation control parameter, wherein the first control loop and the second control loop are each implemented on a basis of a control algorithm of a proportional-integral-derivative type, and wherein an integral control contribution of the first control loop is larger than an integral control contribution of the second control loop.

19. The device according to claim 18, wherein the integral control contribution of the second control loop is substantially zero.

20. The device according to claim 19, comprising:
an error detector configured to generate an error signal on a basis of a comparison between an output signal and a substantially constant reference signal.

21. The device according to claim 20, wherein the first control loop is configured to generate the first control signal from the error signal, and/or wherein the second control loop is configured to generate the second control signal from the error signal.

* * * * *